(12) United States Patent
Lee et al.

(10) Patent No.: US 7,791,384 B2
(45) Date of Patent: Sep. 7, 2010

(54) PHASE SYNCHRONIZATION APPARATUS

(75) Inventors: Hyun Woo Lee, Ichon (KR); Won Joo Yun, Ichon (KR)

(73) Assignee: Hynix Semiconductor Inc. (KR)

(*) Notice: Subject to any disclaimer, the term of this patent is extended or adjusted under 35 U.S.C. 154(b) by 0 days.

(21) Appl. No.: 12/345,149

(22) Filed: Dec. 29, 2008

(65) Prior Publication Data
US 2009/0322391 A1 Dec. 31, 2009

(30) Foreign Application Priority Data
Jun. 26, 2008 (KR) .................... 10-2008-0061057

(51) Int. Cl.
*H03L 7/06* (2006.01)
(52) U.S. Cl. .................... 327/158; 327/149
(58) Field of Classification Search ............... 327/149, 327/158
See application file for complete search history.

(56) References Cited

U.S. PATENT DOCUMENTS

| | | | |
|---|---|---|---|
| 6,621,314 B2 * | 9/2003 | Krishnamurty | 327/158 |
| 7,202,715 B1 * | 4/2007 | Fan | 327/149 |
| 7,274,239 B2 * | 9/2007 | Lin | 327/277 |
| 7,288,997 B2 | 10/2007 | Chen | |
| 7,308,372 B2 * | 12/2007 | Rifani et al. | 702/69 |
| 7,310,021 B2 * | 12/2007 | Familia | 331/17 |
| 7,312,663 B2 | 12/2007 | Abel | |
| 7,489,568 B2 * | 2/2009 | Kim et al. | 365/189.12 |
| 2003/0201809 A1 * | 10/2003 | Gauthier et al. | 327/158 |
| 2004/0012426 A1 * | 1/2004 | Trivedi et al. | 327/158 |
| 2006/0208804 A1 | 9/2006 | Kuo et al. | |
| 2009/0066379 A1 * | 3/2009 | Kim et al. | 327/149 |
| 2009/0146704 A1 * | 6/2009 | Huang | 327/158 |
| 2009/0189657 A1 * | 7/2009 | Huang | 327/158 |
| 2009/0189658 A1 * | 7/2009 | Tomar et al. | 327/158 |
| 2010/0074037 A1 * | 3/2010 | Lin | 365/194 |

* cited by examiner

*Primary Examiner*—Lincoln Donovan
*Assistant Examiner*—Adam D Houston
(74) *Attorney, Agent, or Firm*—Baker & McKenzie LLP

(57) ABSTRACT

A phase synchronization apparatus includes a bias control unit configured to sequentially delay an input clock signal to generate bias control signals having multiple bits, a bias generation unit configured to generate a pull-up bias voltage having a level that corresponds to logical values of the bias control signals, and to generate a pull-down bias voltage in response to a control signal; and a voltage controlled oscillator configured to include a plurality of delay cells respectively having a pull-up terminal and a pull-down terminal to generate an output clock signal in response to the control voltage, wherein the pull-up bias voltage is supplied to the pull-up terminals of the respective delay cells and the pull-down bias voltage is supplied to the pull-down terminals of the respective delay cells.

13 Claims, 6 Drawing Sheets

PHASE SYNCHRONIZATION APPARATUS

CROSS-REFERENCES TO RELATED APPLICATION

The present application claims priority under 35 U.S.C. §119(a) to Korean application number 10-2008-0061057, filed on Jun. 26, 2008, in the Korean Intellectual Property Office, which is incorporated herein by reference in its entirety as if set forth in full.

BACKGROUND

1. Technical Field

The embodiments described herein relate to a phase synchronization apparatus, and more particularly, to a Phase Locked Loop (PLL) circuit used in a semiconductor integrated circuit.

2. Related Art

In general, during implementation of a high-speed semiconductor integrated circuit (IC), as of a frequency of an external clock increases, a frequency of an internal clock also increases. Accordingly, in order to improve adaptability to a high frequency clock, semiconductor ICs are making use of PLL circuits instead of Delay Locked Loop (DLL) circuits as a clock phase synchronization apparatus. Currently, PLL circuits are being used in various fields, such as wired/wireless communication systems including RF systems, and are commonly being used as a phase adjuster, a frequency mixer, and a time dividing system.

A PLL circuit generally includes a phase detector, a charge pump, a low pass filter, a voltage controlled oscillator (VCO), and a clock divider. Here, a gain of the voltage controlled oscillator, i.e., a ratio of a control voltage transmitted through the low pass filter to an output clock, is an important factor in determining operational characteristics of a PLL circuit. A conventional PLL circuit is mainly used as a voltage controlled oscillator having a large gain, and phase fixing operations having short locking times is realized. However, the voltage controlled oscillator having the large gain is problematic in that a frequency band is sensitive to voltage variations and can be easily varied, thereby degrading operational stability. Conversely, when a voltage controlled oscillator having a small gain is used in order to overcome the problems associated with the large gain, operational stability is improved. However, the voltage controlled oscillator having the small gain is also problematic in that a locking time became longer and a usable frequency band became narrower.

As such, since operational performance of a PLL circuit is dependent upon a gain of a voltage controlled oscillator, there is no alternative but to ensure operational stability when using a voltage controlled oscillator having a large gain or ensure short locking times when using a voltage controlled oscillator having a small gain. Accordingly, for high-speed semiconductor ICs, a clock phase synchronization apparatus is required having high operational performance without the above-described problems.

SUMMARY

A phase synchronization apparatus capable of providing operational stability is described herein.

In one aspect, a voltage controlled oscillator including a plurality of delay cells respectively having a pull-up terminal and pull-down terminal and configured to generate an output clock signal in response to the control voltage; and a bias generation unit configured to generate a pull-up bias voltage having a level that corresponds to logical values of multiple bits of bias control signals, and to generate a pull-down bias voltage in response to a control signal; the pull-up bias voltage being supplied to the pull-up terminals of the respective delay cells and the pull-down bias voltage being supplied to the pull-down terminals of the respective delay cells.

In another aspect, a method for phase synchronization in a semiconductor memory apparatus comprises sequentially delaying an input clock signal to generate bias control signals having multiple bits; generating a pull-up bias voltage having a level that corresponds to logical values of the bias control signals; generating a pull-down bias voltage in response to a control signal; and generating an output clock signal in response to the control voltage.

These and other features, aspects, and embodiments are described below in the section "Detailed Description."

BRIEF DESCRIPTION OF THE DRAWINGS

The features, aspects, and embodiments are described in conjunction with the attached drawings, in which.

DETAILED DESCRIPTION

Figure 1:
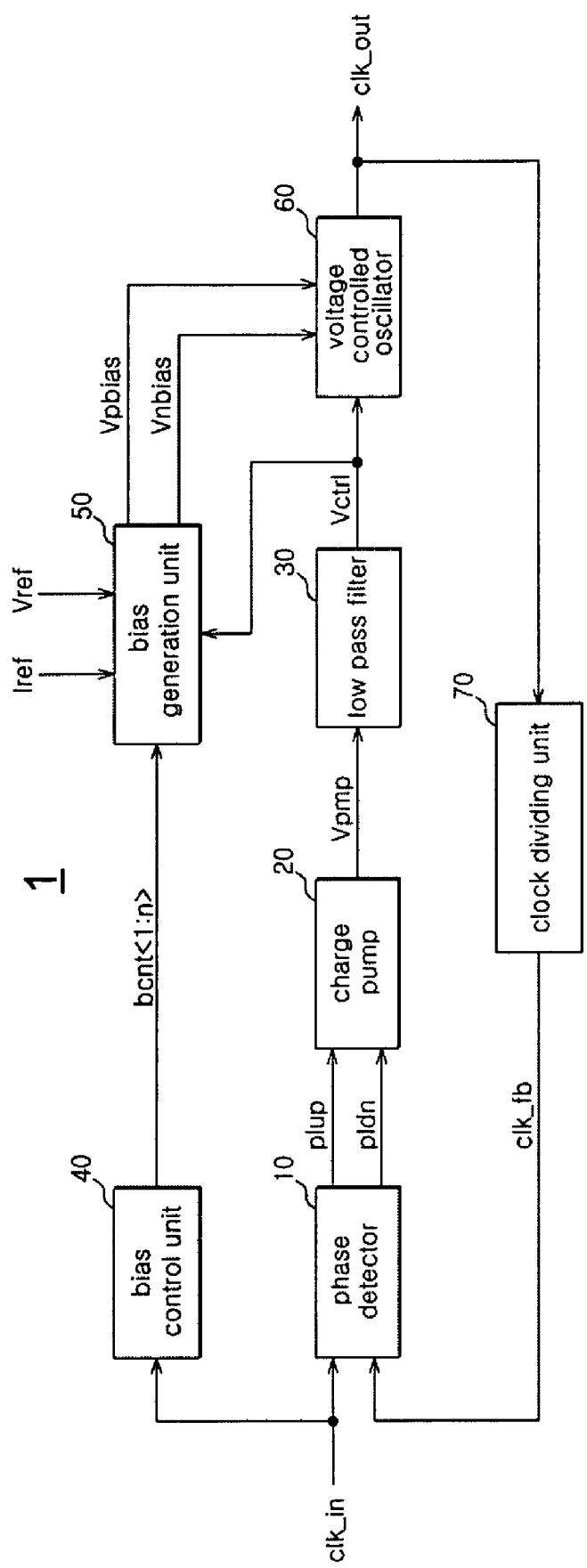
FIG. 1 is a schematic block diagram of an exemplary phase synchronization apparatus according to one embodiment.

FIG. 1 is a schematic block diagram of an exemplary phase synchronization apparatus 1 according to one embodiment. In FIG. 1, the phase synchronization apparatus 1 can be configured to include a phase detector 10, a charge pump 20, a low-pass filter 30, a bias generation unit 50, a voltage controlled oscillator 60, and a clock dividing unit 70.

The phase detector 10 can be configured to compare a phase of an input clock signal 'clk_in' with a phase of a feedback clock signal 'clk_fb' to generate a pull-up control signal 'plup' and a pull-down control signal 'pldn'. The charge pump 20 can be configured to perform a voltage pumping operation in response to the pull-up control signal 'plup' and the pull-down control signal 'pldn' to generate a pumping voltage Vpmp. The low-pass filter 30 can be configured to filter the pumping voltage Vpmp to generate a control voltage Vctrl, and the bias control unit 40 can be configured to generate n-bit bias control signals 'bcnt<1:n>' in response to the input clock signal 'clk_in'. The bias generation unit 50 can be configured to receive a reference current Iref and a reference voltage Vref as inputs to generate a pull-up bias voltage Vpbias and a pull-down bias voltage Vnbias in response to the n-bit control signals 'bcnt<1:n>' and the control voltage Vctrl. The voltage controlled oscillator 60 can be configured to oscillate an output clock signal 'clk_out' in response to the control voltage Vctrl, the pull-up bias voltage Vpbias, and the pull-down bias voltage Vnbias. The clock dividing unit 70 can be configured to divide the output clock signal 'clk_out' by a predetermined division ratio to generate the feedback clock signal 'clk_fb'.

In FIG. 1, the phase detector 10, the charge pump 20, the low pass filter 30, the voltage controlled oscillator 60, and the clock dividing unit 70 can be considered as elements for functioning as a basic PLL circuit. Accordingly, the phase synchronization apparatus 1 can function as the basic PLL circuit and includes the bias control unit 40 and the bias generation unit 50. For example, the bias control unit 40 can sequentially delay the input clock signal 'clk_in', and can compare respective phases of the clock signals generated by sequential delaying operations with a phase of the input clock signal 'clk_in' to generate the n-bit bias control signals 'bcnt<1:n>'. Accordingly, the bias control unit 40 can function as a time-to-digital converter type device that can output a frequency of the input clock signal 'clk_in' as a digital code. In addition, logical values of the n-bit bias control signals 'bcnt<1:n>' can be determined based on a delay amount in a delay operation, wherein the delay amount is preferably determined by means of a test.

In FIG. 1, the bias generation unit 50 can receive the reference current Iref as an input to generate a pull-up bias voltage Vpbias having a level that corresponds to logical values of the n-bit bias control signals 'bcnt<1:n>'. In addition, the bias generation unit 50 can receive the reference voltage Vref as an input to generate a pull-down bias voltage Vnbias in response to the control voltage Vctrl. Here, the levels of the pull-up bias voltage Vpbias can vary according to the logical values of the n-bit bias control signals 'bcnt<1:n>'. Although levels of the control voltage Vctrl can vary to be lower than a critical value or levels of the pull-up bias voltage Vpbias can vary, the pull-down bias voltage Vnbias can maintains its level to be constant, which makes it possible to support stable operation of the voltage controlled oscillator 60.

The voltage controlled oscillator 60 can be configured to include a plurality of delay cells having differential amplifier arrangements to generate an output clock signal 'clk_out' in response to the control voltage Vctrl. Accordingly, the pull-up bias voltage Vpbias can be supplied to pull-up terminals of the respective delay cells and the pull-down bias voltage Vnbias can be supplied to pull-down terminals of the respective delay cells. In addition, the output clock signal 'clk_out' output from the voltage controlled oscillator 60 can have a frequency that corresponds to the control voltage Vctrl. The voltage controlled oscillator 60 can control the frequency of the output clock signal 'clk_out' in response to not only the control voltage Vctrl but also the pull-up bias voltage Vpbias.

In FIG. 1, the phase synchronization apparatus 1 can perform operational control of the frequency of the output clock signal 'clk_out' in response to the control voltage Vctrl by using the voltage controlled oscillator 60. In addition, the phase synchronization apparatus 1 can generate the bias control signals 'bcnt<1:n>' by using the bias control unit 40, and can generate the pull-up bias voltage Vpbias corresponding to logical values of the bias control signals 'bcnt<1:n>'. Then, the phase synchronization apparatus 1 can control the voltage controlled oscillator 60 to operate in response to the pull-up bias voltage Vpbias. Thus, the voltage controlled oscillator 60 can have a small gain, wherein its frequency band can be selected by the pull-up bias voltage Vpbias. Since the levels of the pull-up bias voltage Vpbias can be determined based upon the logical values of the bias control signals 'bcnt<1:n>', an operation frequency band of the voltage controlled oscillator 60 can be determined based on the bias control signals 'bcnt<1:n>'.

Figure 2A:
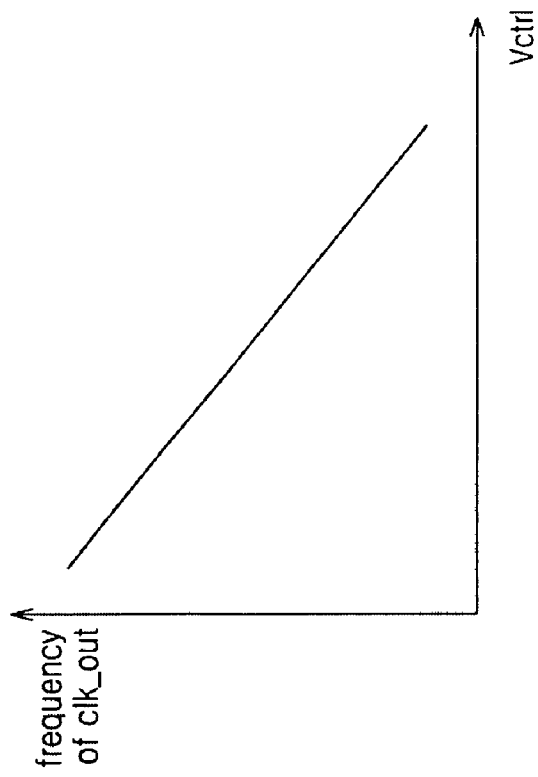
FIGS. 2A and 2B are graphical representations illustrating exemplary operational characteristics of the apparatus of FIG. 1 according to one embodiment.
Figure 2B:
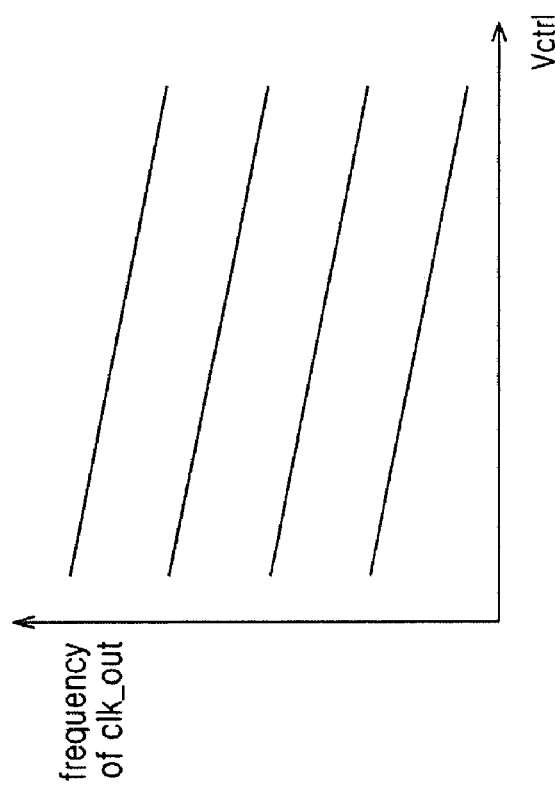

FIGS. 2A and 2B are graphical representations illustrating exemplary operational characteristics of the apparatus 1 of FIG. 1 according to one embodiment. In FIG. 2A, shows a gain of a voltage controlled oscillator according to a common PLL circuit. As shown, since the gain of a voltage controlled oscillator has a steep slope and, accordingly, a frequency of the output clock signal 'clk_out' sensitively responds to variations of a control voltage Vctrl, operational stability is degraded.

However, as shown in FIG. 2B, a gain of the voltage controlled oscillator 60 has a slow slope in the phase synchronization apparatus 1. In order to prevent a narrowing of usable frequency band, the usable frequency band is specified by various levels, i.e., 4 levels are shown. For example, the levels represent gains in the usable frequency band, wherein the bias control signals 'bcnt<1:n>' can perform a selecting operation among the 4 levels of the usable frequency band. Alternatively, more or less than the 4 levels may be illustrated to represent more or less gains in the usable frequency bands.

Accordingly, the voltage controlled oscillator 60 of the phase synchronization apparatus 1 is capable of insensitively responding to variations of the level of the control voltage Vctrl, and can have a wide usable frequency band, thereby securing operational stability of the phase synchronization apparatus 1.

Figure 3:
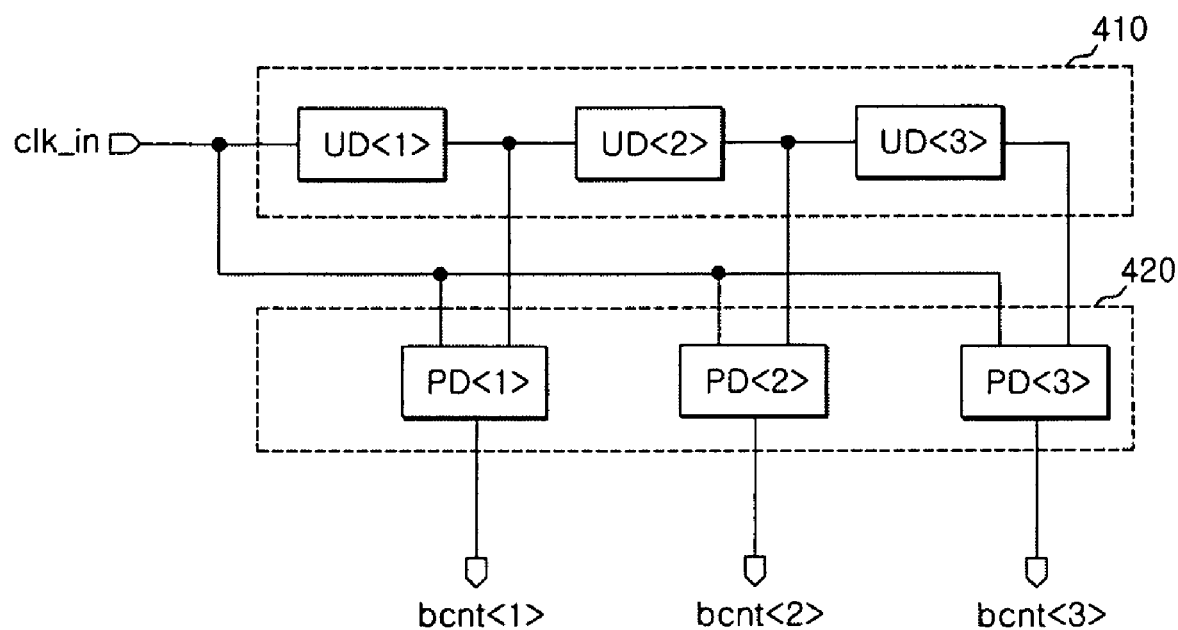
FIG. 3 is a schematic circuit diagram of an exemplary bias control unit capable of being implemented in the apparatus of FIG. 1 according to one embodiment.

FIG. 3 is a schematic circuit diagram of an exemplary bias control unit 40 capable of being implemented in the apparatus 1 of FIG. 1 according to one embodiment. In FIG. 3, the total number of bits of the bias control signals 'bcnt<1:n>' is exemplified as 3, but more or less than the 3 number of bits of the bias control signals 'bcnt<1:n>' may be used.

As shown in FIG. 3, the bias control unit 40 can include a delay unit 410 configured to sequentially delay the input clock signal 'clk_in' and a phase comparing unit 420 configured to compare respective phases of 3 signals sequentially delayed in the delay unit 410 with a phase of the input clock signal 'clk_in' to generate the 3-bit bias control signals 'bcnt<1:3>'. For example, the delay unit 410 can include 3 unit delay devices UD<1:3> that are connected in series to sequentially delay the input clock signal 'clk_in'. Similarly, the phase comparing unit 420 can include 3 phase comparing devices PD<1:3> that respectively receive the input clock signal 'clk_in' and output signals of the 3 unit delay devices UD<1:3> to output respective bits of the 3-bit bias control signals 'bcnt<1:3>'. Alternatively, the bias control unit 40 and the phase comparing unit 420 can be configured to delay and compare more or less than the 3 exemplary signals.

In FIG. 3, by using the bias control unit 40, the 3-bit bias control signals 'bcnt<1:3>' can be generated by sequentially delaying the input clock signal 'clk_in' and then performing edge triggering operations on the input clock signal 'clk_in' at rising edge times of the delayed signals. Here, the number of bits having logical values '1', which are included in the 3-bit bias control signals 'bcnt<1:3>', can vary according to respective delay values of the 3 unit delay devices UD<1:3> in the delay unit 410. For example, the delay values of the 3 unit delay devices UD<1:3> can be controlled by means of a test so that logical values of the 3-bit bias control signals 'bcnt<1:3>' can be realized as - - - 1, 0, 0 - - -, or - - - 1, 1, 0 - - -, or - - - 1, 1, 1 - - -.

Figure 4:
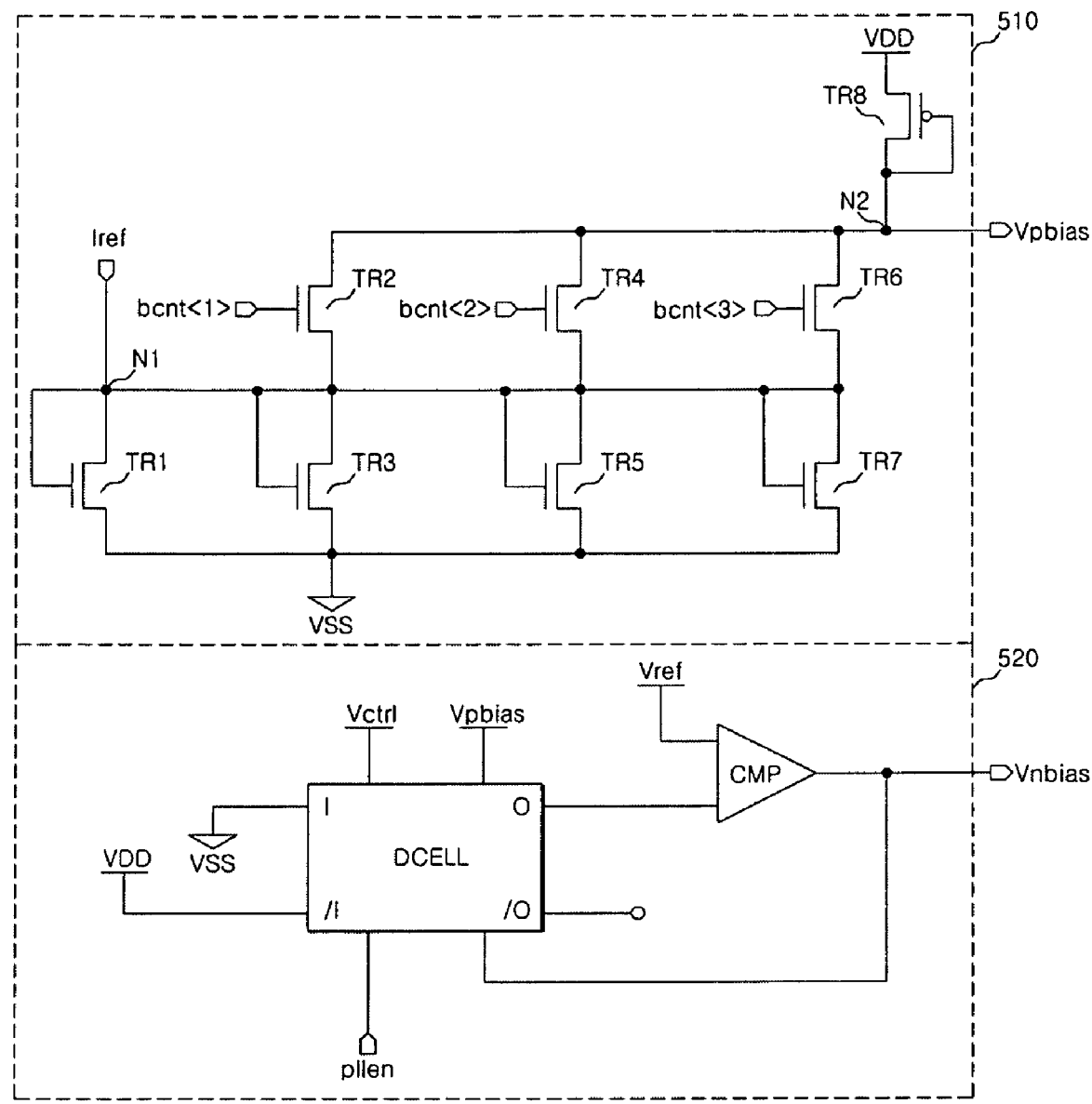
FIG. 4 is a schematic circuit diagram of an exemplary bias generation unit capable of being implemented in the apparatus of FIG. 1 according to one embodiment.

FIG. 4 is a schematic circuit diagram of an exemplary bias generation unit 50 capable of being implemented in the apparatus 1 of FIG. 1 according to one embodiment. In FIG. 1, the total number of bits of the bias control signals 'bcnt<1:n>' is also exemplified as 3, but more or less than the 3 number of bits of the bias control signals 'bcnt<1:n>' may be used.

As shown in FIG. 4, the bias generation unit 50 can include a pull-up bias generation unit 510 configured to generate the pull-up bias voltage Vpbias in response to the reference current Iref and the 3-bit bias control signals 'bcnt<1:3>', and a pull-down bias generation unit 520 configured to generate the pull-down bias voltage Vnbias in response to the reference voltage Vref, the control voltage Vctrl, the pull-up bias voltage Vpbias, and a PLL enable signal 'pllen'.

The pull-up bias generation unit 510 can include a first node (N1) to receive the reference current Iref, a second node (N2) to output the pull-up bias voltage Vpbias, a plurality of transistors TR1, TR3, TR5, and TR7 connected between the first node (N1) and a ground voltage VSS in parallel, wherein gate and drain terminals can be commonly connected to the first node (N1) and source terminals can be connected to the ground voltage VSS. In addition, the pull-up bias generation unit 510 can include a plurality of transistors TR2, TR4, and TR6 connected between the second node (N2) and the first node (N1) in parallel, wherein gate terminals can sequentially receive respective bits of the bias control signals 'bcnt<1:3>', drain terminals can be connected to the second node (N2), and source terminals can be connected to the first node (N1). Moreover, the pull-up bias generation unit 510 can include an eighth transistor TR8 having a gate terminal and a drain terminal commonly connected to the second node (N2), and a source terminal supplied with an external supply voltage VDD.

In FIG. 4, the first transistor TR1 has a gate terminal and a drain terminal commonly connected to the first node (N1), and a source terminal connected to a ground VSS, and the second transistor TR2 has a gate terminal to which a first bit bcnt<1> of the bias control signals is input, a drain terminal connected to the second node (N2), and a source terminal connected to the first node (N1). The third transistor TR3 has a gate terminal and a drain terminal commonly connected to the first node (N1), and a source terminal connected to a ground VSS, and the fourth transistor TR4 has a gate terminal to which a second bit bcnt<2> of the bias control signals is input, a drain terminal connected to the second node (N2), and a source terminal connected to the first node (N1). In addition, the fifth transistor TR5 has a gate terminal and a drain terminal commonly connected to the first node (N1), and a source terminal connected to a ground VSS, and the sixth transistor TR6 has a gate terminal to which a third bit bcnt<3> of the bias control signals is input, a drain terminal connected to the second node (N2), and a source terminal connected to the first node (N1). Moreover, the seventh transistor TR7 has a gate terminal and a drain terminal commonly connected to the first node (N1), and a source terminal connected to a ground VSS.

The pull-down bias generation unit 520 includes a delay cell DCELL configured to have a positive input terminal I to which a ground voltage VSS can be input, and a negative input terminal /I to which the external supply voltage VDD can be input. Accordingly, delay cell DCELL can perform a delay operation in response to the control voltage Vctrl, the pull-up bias voltage Vpbias, and the PLL enable signal 'pllen' to output an output signal through a positive output terminal O. In addition, the pull-down bias generation unit 520 includes a comparator CMP configured to compare a level of the reference voltage Vref with a level of the output signal of the delay cell DCELL to generate the pull-down bias voltage Vnbias.

In the pull-up bias generation unit 510, the reference current Iref can be assumed to be constant, and a voltage level of the pull-up bias voltage Vpbias supplied to the second node N2 can be determined based upon logical values of the 3-bit bias control signals 'bcnt<1:3>'. For example, among the 3-bit bias control signals 'bcnt<1:3>', the more the number of bits have logical values '1', the lower the level of the pull-up bias voltage Vpbias. Conversely, the less the number of bits have logical values '1', the higher the level of the pull-up bias voltage Vpbias.

The delay cell DCELL included in the pull-down bias generation unit 520 can have substantially the same structure as delay cells included in the voltage controlled oscillator 60. Accordingly, a voltage level of a signal output from the delay cell DCELL may vary according to variations of the level of the pull-up bias voltage Vpbias. However, if a lowest level, which the output signal may have when the delay cell DCELL operates in a normal state, can be set to be higher than a level of the reference voltage Vref, then a level of the pull-down bias voltage Vnbias output from the comparator CMP can be maintained to be constant.

Figure 5:
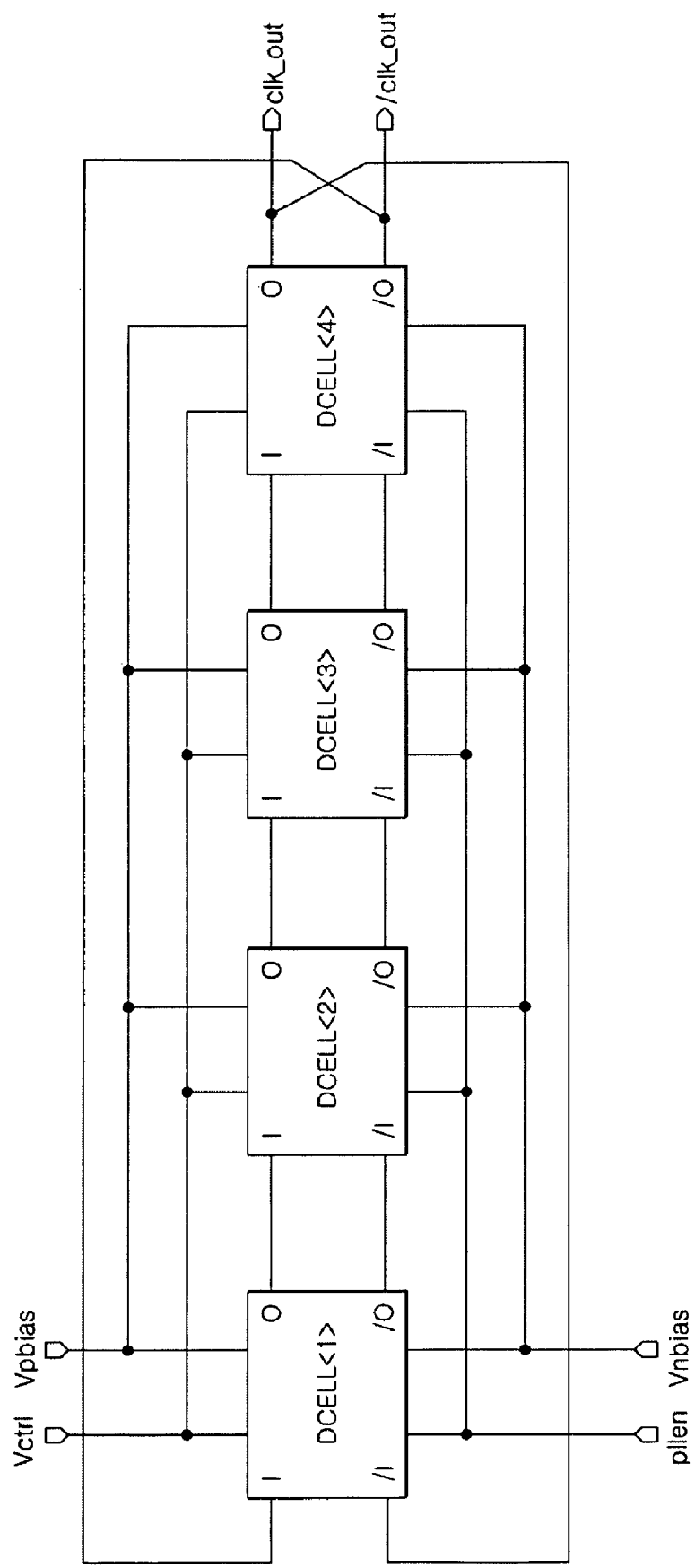
FIG. 5 is a schematic circuit diagram of an exemplary voltage controlled oscillator capable of being implemented in the apparatus of FIG. 1 according to one embodiment.

FIG. 5 is a schematic circuit diagram of an exemplary voltage controlled oscillator 60 capable of being implemented in the apparatus 1 of FIG. 1 according to one embodiment. In FIG. 5, the voltage controlled oscillator 60 can be configured to include first to fourth delay cells DCELL<1:4> that respectively delay an output signal pair of a previous delay cell in response to the control voltage Vctrl, the PLL enable signal 'pllen', the pull-up bias voltage Vpbias, and the pull-down bias voltage Vnbias to generate an output signal pair and then respectively transfer the output signal pair to a next delay cell. For example, the output clock signal 'clk_out' can be realized as a clock signal pair 'clk_out' and '/clk_out' having opposite phases to each other, wherein the fourth delay cell DCELL<4> can output the output clock signal pair 'clk_out' and '/clk_out' as output signals. In addition, the first delay cell DCELL<1> can receive the output clock signal pair 'clk_out' and '/clk_out' as inputs, wherein the negative output clock signal '/clk_out' can be received through a positive input terminal I and the positive output clock signal 'clk_out' through a negative input terminal/I of the first delay cell DCELL <1>.

In FIG. 5, when the PLL enable signal 'pllen' is enabled and the control voltage Vctrl has a voltage level higher than a predetermined level, the voltage controlled oscillator 60 can begin to perform an oscillating operation and then toggle the output clock signal pair 'clk_out' and '/clk_out'. Accordingly, a usable frequency band of the output clock signal pair 'clk_out' and '/clk_out' can be determined based on a level of the pull-up bias voltage Vpbias. Then, the output clock signal pair 'clk_out' and '/clk_out' can have a frequency corresponding to the level of the control voltage Vctrl. Here, when the level of the control voltage Vctrl varies, the frequency of the output clock signal pair 'clk_out' and '/clk_out' can also vary correspondingly to the variations of the level of the control voltage Vctrl.

The respective delay cells DCELL<1:4> of the voltage controlled oscillator 60 make a gain of the delay cells DCELL<1:4> relatively small by combining devices, i.e., a variation width of the frequency of the output clock signal pair 'clk_out' and '/clk_out' with respect to a variation of the level of the control voltage Vctrl. Accordingly, although the voltage controlled oscillator 60 can operate by using delay cells DCELL<1:4> having a small gain, since the pull-up bias voltage Vpbias determines the usable frequency band of the output clock signal pair 'clk_out' and '/clk_out' narrowing of the usable frequency band of the output clock signal pair 'clk_out' and '/clk_out' is not problematic. Moreover, since the level of the pull-down bias voltage Vnbias can be maintained to be constant, operational stability of the phase synchronization apparatus 1 (in FIG. 1) can be obtained.

Figure 6:
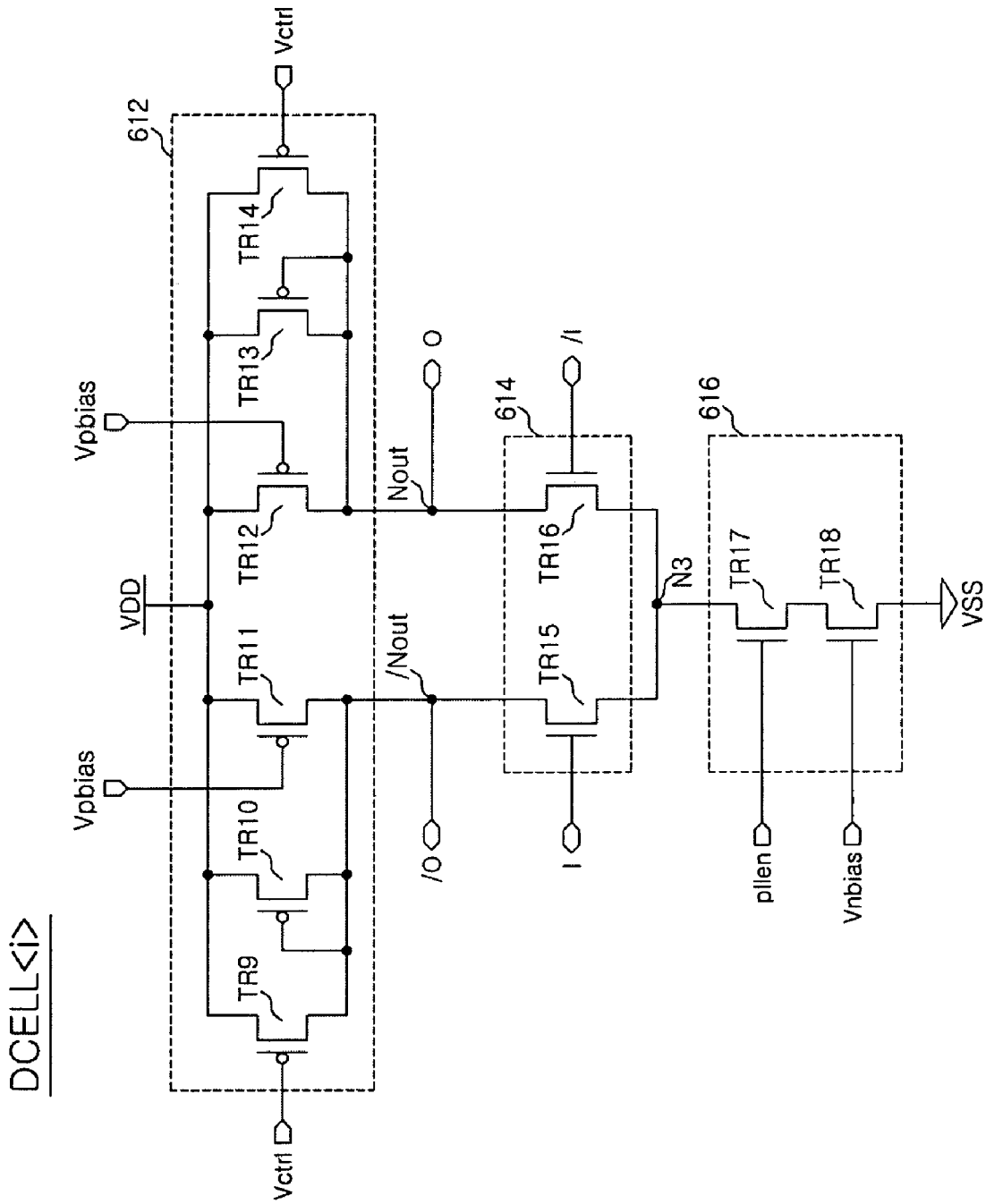
FIG. 6 is a schematic circuit diagram of an exemplary delay cell capable of being implemented in the oscillator of FIG. 5 according to one embodiment.

FIG. 6 is a schematic circuit diagram of an exemplary delay cell capable of being implemented in the oscillator of FIG. 5 according to one embodiment. In FIG. 6, since all of the delay cells DCELL<1:4> can be substantially the same, only one DCELL<i> among the delay cells is shown as an example, for the sake of brevity.

As shown in FIG. 6, the delay cell DCELL<i> can include an input terminal pair I and /I, an output terminal pair O and /O, an output node pair (Nout) and (/Nout) connected to the output terminal pair O and /O, respectively, a third node N3, a frequency control unit 612, an input unit 614, and an operation control unit 616.

The frequency control unit 612 can be configured to control a frequency of signals supplied to the output node pair (Nout) and (/Nout) in response to the control voltage Vctrl and the pull-up bias voltage Vpbias. The input unit 614 can be configured to control electric potentials of the output node pair (Nout) and (/Nout) in response to signals input through the input terminal pair I and /I. The operation control unit 616 can be configured to control operations of the frequency control unit 612 and the input unit 614 in response to the PLL enable signal 'pllen' and the pull-down bias voltage Vnbias.

The frequency control unit 612 can includes a ninth transistor TR9 having a gate terminal to which the control voltage Vctrl can be supplied, a source terminal to which the external supply voltage VDD can be supplied, and a drain terminal connected to the negative output node (/Nout), and a tenth transistor TR10 having a gate terminal and a drain terminal commonly connected to the negative output node (/Nout), and a source terminal to which the external supply voltage VDD can be supplied. In addition, the frequency control unit 612 can include an eleventh transistor TR11 having a gate terminal to which the pull-up bias voltage Vpbias can be supplied, a source terminal to which the external supply voltage VDD can be supplied, and a drain terminal connected to the negative output node (/Nout), and a twelfth transistor TR12 having a gate terminal to which the pull-up bias voltage Vpbias can be supplied, a source terminal to which the external supply voltage VDD can be supplied, and a drain terminal connected to the positive output node (Nout). Moreover, the frequency control unit 612 can include a thirteenth transistor TR13 having a gate terminal and a drain terminal commonly connected to the positive output node (Nout), and a source terminal to which the external supply voltage VDD can be supplied, and a fourteenth transistor TR14 having a gate terminal to which the control voltage Vctrl can be supplied, a source terminal to which the external supply voltage VDD can be supplied, and a drain terminal connected to the positive output node (Nout).

The input unit 614 can include a fifteenth transistor TR15 having a gate terminal connected to a positive input terminal I, a drain terminal connected to the negative output node (/Nout), and a source terminal connected to the third node (N3), and a sixteenth transistor TR16 having a gate terminal connected to a negative input terminal /I, a drain terminal connected to the positive output node (Nout), and a source terminal connected to the third node (N3).

The operation control unit 616 can include a seventeenth transistor TR17 having a gate terminal to which the PLL enable signal 'pllen' can be input, and a drain terminal connected to the third node (N3), and an eighteenth transistor TR18 having a gate terminal to which the pull-down bias voltage Vnbias can be supplied, a drain terminal connected to the source terminal of the seventeenth transistor TR17, and a source terminal connected to a ground voltage VSS.

Accordingly, the delay cell DCELL<i> is capable to begin to operate when the PLL enable signal 'pllen' input to the operation control unit 616 is enabled. Since the level of the pull-down bias voltage Vnbias input to the operation control unit 616 can be maintained to be constant, the delay cell DCELL<i> is able to stably operate.

The input unit 614 is configured to operate as follows: when a signal of logical high level is input to the positive input terminal I and a signal of logical low level is input to the negative input terminal /I, an electric potential of the positive output node (Nout) is asserted to a high level and an electric potential of the negative output node (/Nout) is lowered to a low level. In a similar manner, when a signal of logical low level is input to the positive input terminal I and a signal of logical high level is input to the negative input terminal /I, an electric potential of the positive output node (Nout) is lowered to a low level and an electric potential of the negative output node (/Nout) is asserted to a high level.

A frequency of a signal pair, which are output through the output node pair (Nout) and (/Nout) and the output terminal pair O and /O, corresponds to levels of the control voltage Vctrl and the pull-up bias voltage Vpbias. For example, the lower the level of the control voltage Vctrl or the lower the level of the pull-up bias voltage Vpbias, the higher the frequency of the output signal pair will be. Likewise, the higher the level of the control voltage Vctrl or the higher the level of the pull-up bias voltage Vpbias, the lower the frequency of the output signal pair will be. As a result, a usable frequency band of the output signal pair can be determined according to the level of the pull-up bias voltage Vpbias, and a frequency thereof can be controlled according to the level of the control voltage Vctrl.

A phase synchronization apparatus can further include a bias control unit other than a general PLL circuit structure, such that the bias control unit can generate bias control signals having multiple bits by performing operations of sequentially delaying an input clock signal. Moreover, the phase synchronization apparatus can further include a bias generation unit that generates a pull-up bias voltage, the level of which can be controlled in response to the bias control signals having multiple bits, and then provide the pull-up bias voltage to a voltage controlled oscillator. Here, the voltage controlled oscillator can have a usable frequency band that corresponds to a level of the pull-up bias voltage, and can control a frequency of an output clock signal according to a control voltage. Since the voltage controlled oscillator can have a small gain and a usable frequency band can be selected, the phase synchronization apparatus can avoid the problems of frequency band narrowing and perform a stable operation. In addition, since an operation of the voltage controlled oscillator can be stabilized by using a pull-down bias voltage having a constant level, operational stability of the phase synchronization apparatus can be improved.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A phase synchronization apparatus, comprising:
    a voltage controlled oscillator including a plurality of delay cells respectively having a pull-up terminal and a pull-down terminal and configured to generate an output clock signal in response to a control voltage; and a bias generation unit configured to generate a pull-up bias voltage according to bias control signals, and to generate a pull-down bias voltage in response to a control signals, the pull-up bias voltage being supplied to the pull-up terminals of the respective delay cells and the pull-down bias voltage being supplied to the pull-down terminals of the respective delay cells.

2. The phase synchronization apparatus of claim 1, further comprising a bias control unit configured to generate the bias control signals representing frequency of an input clock.

3. The phase synchronization apparatus of claim 2, further comprising a bias control unit configured to sequentially delay an input clock signal to generate the bias control signals, the bias control signals having multiple bits.

4. The phase synchronization apparatus of claim 3, wherein the bias control unit includes:
   a delay unit configured to sequentially delay the input clock signal; and
   a phase comparing unit configured to compare respective phases of signals sequentially delayed in the delay unit with a phase of the input clock signal to generate the bias control signals having multiple bits.

5. The phase synchronization apparatus of claim 1, further comprising a bias generation unit configured to generate a pull-up bias voltage having a level that corresponds to logical values of multiple bits of bias control signals.

6. The phase synchronization apparatus of claim 1, wherein the bias generation unit is configured to generate a pull-down bias voltage that has a constant level regardless of whether a level of the control voltage varies to be lower than a critical value or a level of the pull-up bias voltage varies.

7. The phase synchronization apparatus of claim 1, wherein the bias generation unit includes:
   a pull-up bias generation unit configured to generate the pull-up bias voltage in response to a reference current and the bias control signals having multiple bits; and
   a pull-down bias generation unit configured to generate the pull-down bias voltage in response to a reference voltage, the control voltage, the pull-up bias voltage, and a PLL enable signal.

8. The phase synchronization apparatus of claim 6, wherein the bias generation unit includes:
   a pull-up bias generation unit configured to generate the pull-up bias voltage in response to a reference current and the bias control signals having multiple bits; and
   a pull-down bias generation unit configured to generate the pull-down bias voltage in response to a reference voltage, the control voltage, the pull-up bias voltage, and a PLL enable signal.

9. The phase synchronization apparatus of claim 1, wherein the voltage controlled oscillator is configured to set a usable frequency band of the output clock signal in response to the pull-up bias voltage, and control a frequency of the output clock signal in response to the control voltage.

10. The phase synchronization apparatus of claim 1, wherein the plurality of delay cells of the voltage controlled oscillator are structured such that each delays an output signal pair of a previous delay cell in response to the control voltage, the PLL enable signal, the pull-up bias voltage, and the pull-down bias voltage to generate an output signal pair and then transfers the output signal pair to a next delay cell, and a first delay cell receives as a feedback an output signal pair of a last delay cell.

11. The phase synchronization apparatus of claim 9, wherein the plurality of delay cells of the voltage controlled oscillator are structured such that each delays an output signal pair of a previous delay cell in response to the control voltage, the PLL enable signal, the pull-up bias voltage, and the pull-down bias voltage to generate an output signal pair and then transfers the output signal pair to a next delay cell, and a first delay cell receives as a feedback an output signal pair of a last delay cell.

12. The phase synchronization apparatus of claim 11, wherein the plurality of delay cells respectively include:
   a frequency control unit configured to control a frequency of signals that are supplied to an output node pair in response to the control voltage and the pull-up bias voltage;
   an input unit configured to control electric potentials of the output node pair in response to signals input through an input terminal pair; and
   an operation control unit configured to control operations of the frequency control unit and the input unit in response to the PLL enable signal and the pull-down bias voltage.

13. The phase synchronization apparatus of claim 1, wherein the phase synchronization apparatus further includes:
   a phase detector configured to compare a phase of the input clock signal with a phase of a feedback clock signal to generate a pull-up control signal and a pull-down control signal;
   a charge pump configured to perform a voltage pumping operation in response to the pull-up control signal and the pull-down control signal to generate a pumping voltage;
   a low-pass filter configured to filter the pumping voltage to generate the control voltage; and
   a clock dividing unit configured to divide the output clock signal by a predetermined division ratio to generate the feedback clock signal.

* * * * *